(12) United States Patent
Lee et al.

(10) Patent No.: US 8,505,190 B2
(45) Date of Patent: Aug. 13, 2013

(54) METHOD OF MANUFACTURING INERTIAL SENSOR

(75) Inventors: Hyun Kee Lee, Gyunggi-do (KR); Tae Joon Park, Daejeon (KR); Sang Kee Yoon, Gyunggi-do (KR); Hyung Jae Park, Gyunggi-do (KR); Yeong Gyu Lee, Gyunggi-do (KR); Heung Woo Park, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 42 days.

(21) Appl. No.: 13/180,289

(22) Filed: Jul. 11, 2011

(65) Prior Publication Data

US 2012/0266460 A1  Oct. 25, 2012

(30) Foreign Application Priority Data

Apr. 20, 2011 (KR) .................. 10-2011-0036961

(51) Int. Cl.
*G01R 3/00* (2006.01)
(52) U.S. Cl.
USPC ............. 29/595; 29/592.1; 29/602.1; 29/594; 29/609.1; 181/171; 181/172; 216/62; 216/65; 216/66; 310/321; 310/328; 310/330; 310/331; 310/332; 381/396; 381/398

(58) Field of Classification Search
USPC ............. 29/592.1, 594, 595, 609.1; 181/171, 181/172; 216/62, 65, 66; 310/321, 328, 310/330, 331, 332; 381/396, 398
See application file for complete search history.

(56) References Cited

U.S. PATENT DOCUMENTS

| | | | |
|---|---|---|---|
| 6,127,017 A * | 10/2000 | Hirata et al. ................. | 428/64.1 |
| 6,333,089 B1 * | 12/2001 | Hirata et al. ................. | 428/64.1 |
| 6,406,636 B1 * | 6/2002 | Vaganov ........................... | 216/2 |
| 6,764,605 B2 * | 7/2004 | Donaldson et al. ............. | 216/39 |
| 2009/0087712 A1 * | 4/2009 | Huang et al. ..................... | 429/30 |
| 2010/0107761 A1 * | 5/2010 | Ofri et al. .................. | 73/504.13 |
| 2011/0290022 A1 * | 12/2011 | Kim et al. ................... | 73/514.01 |

* cited by examiner

*Primary Examiner* — Paul D Kim
(74) *Attorney, Agent, or Firm* — Ladas & Parry, LLP (57) ABSTRACT

Disclosed herein is a method of manufacturing an inertial sensor. The method of manufacturing an inertial sensor 100 includes (A) applying a polymer 120 to a base substrate 110, (B) patterning the polymer 120 so as to form an opening part 125 in the polymer 120, (C) completing a cap 130 by forming a cavity 115 on the base substrate 110 exposed fro the opening part 125 through an etching process in a thickness direction, and (D) bonding the cap 130 to a device substrate 140 by using a polymer 120, whereby the polymer 120 is applied to the base substrate 110 in a constant thickness D3, such that the cap 130 may be easily bonded to the device substrate 140 by using the polymer 120.

12 Claims, 7 Drawing Sheets

FIG.1

Prior Art

FIG.2

Prior Art

FIG.3

Prior Art

FIG.4

Prior Art

FIG.5

Prior Art

FIG.6

Prior Art

METHOD OF MANUFACTURING INERTIAL SENSOR

CROSS REFERENCE TO RELATED APPLICATION

This application claims the benefit of Korean Patent Application No. 10-2011-0036961, filed on Apr. 20, 2011, entitled "Method Of Manufacturing Inertial Sensor" which is hereby incorporated by reference in its entirety into this application.

BACKGROUND OF THE INVENTION

1. Technical Field

The present invention relates to a method of manufacturing an inertial sensor.

2. Description of the Related Art

Recently, an inertial sensor has been used as various fields, for example, the military such as an artificial satellite, a missile, an unmanned aircraft, or the like, vehicles such as an air bag, electronic stability control (ESC), a black box for a vehicle, or the like, hand shaking prevention of a camcorder, motion sensing of a mobile phone or a game machine, navigation, or the like.

The inertial sensor generally adopts a configuration in which a flexible substrate such as membrane is bonded to a mass body so as to measure acceleration and angular velocity Through the configuration, the inertial sensor may calculate the acceleration by measuring inertial force applied to the mass body and may calculate the angular velocity by measuring Coriolis force applied to the mass body.

In detail, a process of measuring the acceleration and the angular velocity by using the inertial sensor is as follows. First, the acceleration may be implemented by Newton's law of motion "F=ma", where "F" represents inertial force applied to the mass body, "m" represents a mass of the mass body, and "a" is acceleration to be measured. Therefore, the acceleration a may be obtained by measuring a force F applied to the mass body and dividing the measured force by the mass m of the mass body that is a predetermined value. Meanwhile, the angular velocity may be obtained by Coriolis force "F=2mΩ·v", where "F" represents the Coriolis force applied to the mass body, "m" represents the mass of the mass body, "Ω" represents the angular velocity to be measured, and "v" represents motion velocity. Among others, since the motion velocity V of the mass body and the mass m of the mass body are recognized in advance, the angular velocity Ω may be obtained by measuring the Coriolis force (F) applied to the mass body.

As described above, when the inertial sensor measures the acceleration a by using the inertial force F, the mass body is displaced by the inertial force F and when the inertial sensor measures the angular velocity Ω by using the Coriolis force F, the mass body is vibrated by a predetermined motion velocity V. As described above, in order to measure the acceleration a or the angular velocity Ω, the movement of the mass body is essential and thus, a cap protecting the inertial sensor is provided with a cavity so as to secure a space in which the mass body may move.

With reference to the process of forming the cavity in the cap, FIGS. 1 to 6 show process cross-sectional views showing a method of manufacturing an inertial sensor according to the prior art. The problems of the prior art will be described with reference to FIGS. 1 to 6.

Figure 1:
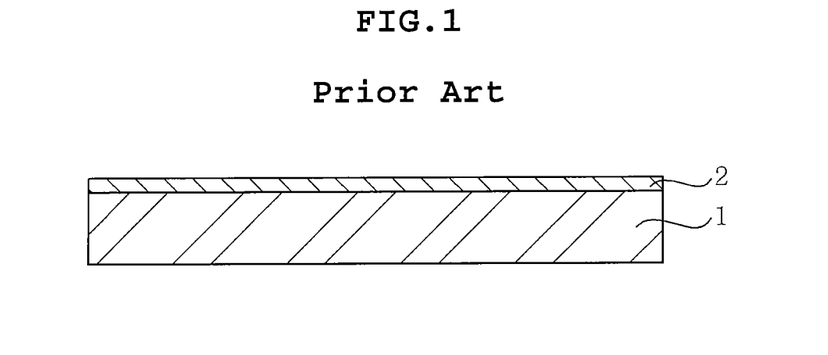
FIGS. 1 to 6 are process cross-sectional views showing a method of manufacturing an inertial sensor according to the prior art.

First, as shown in FIG. 1, a process of applying a photosensitive resist 2 to a substrate 1 is performed. In this case, the photosensitive resist 2 is to optionally perform wet etching on the substrate 1. As the photosensitive resist 2, a dry film or a liquid-phase photosensitive material may be used.

Figure 2:
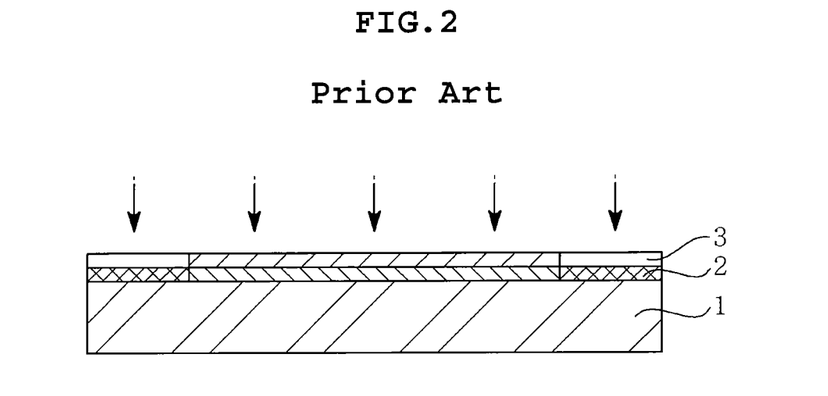

Next, as shown in FIG. 2, a process of optionally hardening the photosensitive resist 2 is performed. In detail, a photomask 3 adheres to the photosensitive resist 2 and is then exposed to ultraviolet rays (an arrow) to harden a border of the photosensitive resist 2.

Figure 3:
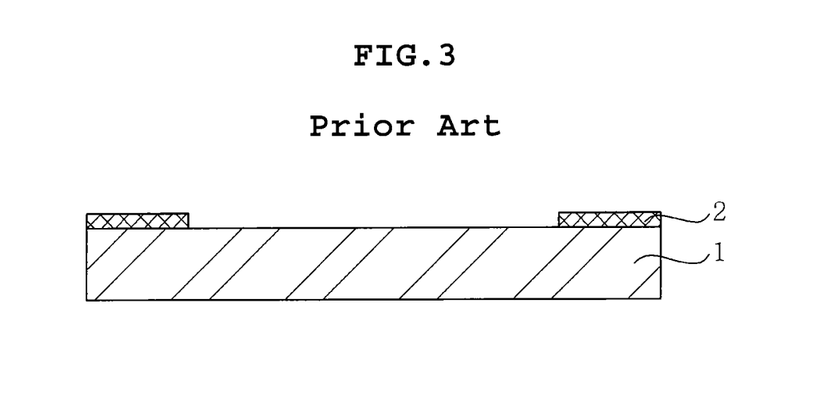

Next, as shown in FIG. 3, a process of patterning the photosensitive resist 2 is performed. In this case, a central portion of the photosensitive resist 2, which is not hardened, is dissolved by a developer such as sodium carbonate, potassium carbonate, or the like, and then removed.

Figure 4:
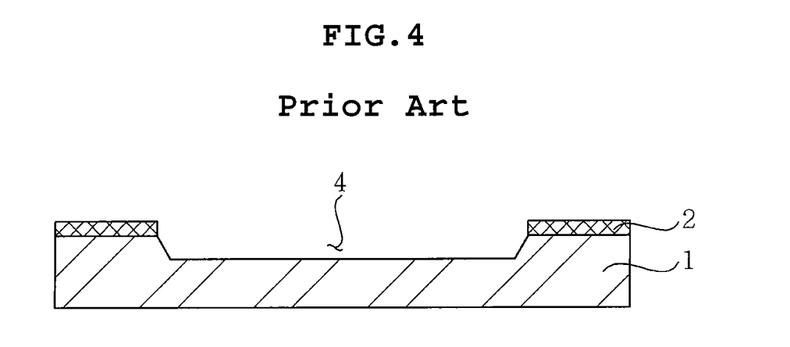

Next, as shown in FIG. 4, a process of forming the cavity 4 on the substrate 1 is performed. The photosensitive resistive 2 remains only on a portion corresponding to the border of the substrate 1 since the photosensitive resist 2 is patterned at the previous step. Therefore, when the substrate 1 is subjected to the wet etching by using the photosensitive resist 2 as an etching resist, the cavity 4 may be formed at the central portion of the substrate 1.

Figure 5:
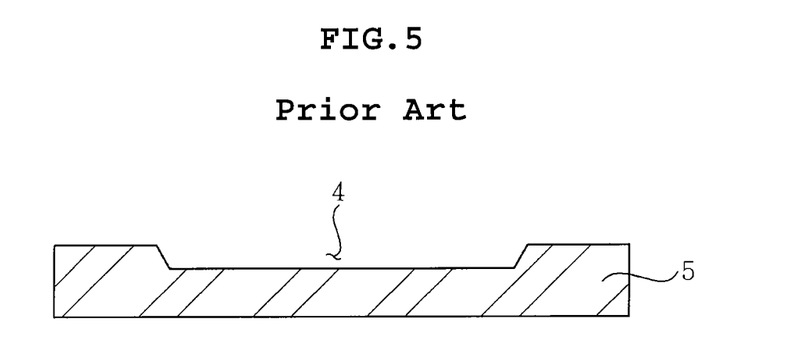

Next, as shown in FIG. 5, a process of removing the photosensitive resist 2 from the substrate 1 is performed. The photosensitive resist 2 is not needed any more since the cavity 4 is formed on the substrate 1 at the previous step and the manufacture of a cap 5 may complete by removing the photosensitive resist 2 at the present process.

Figure 6:
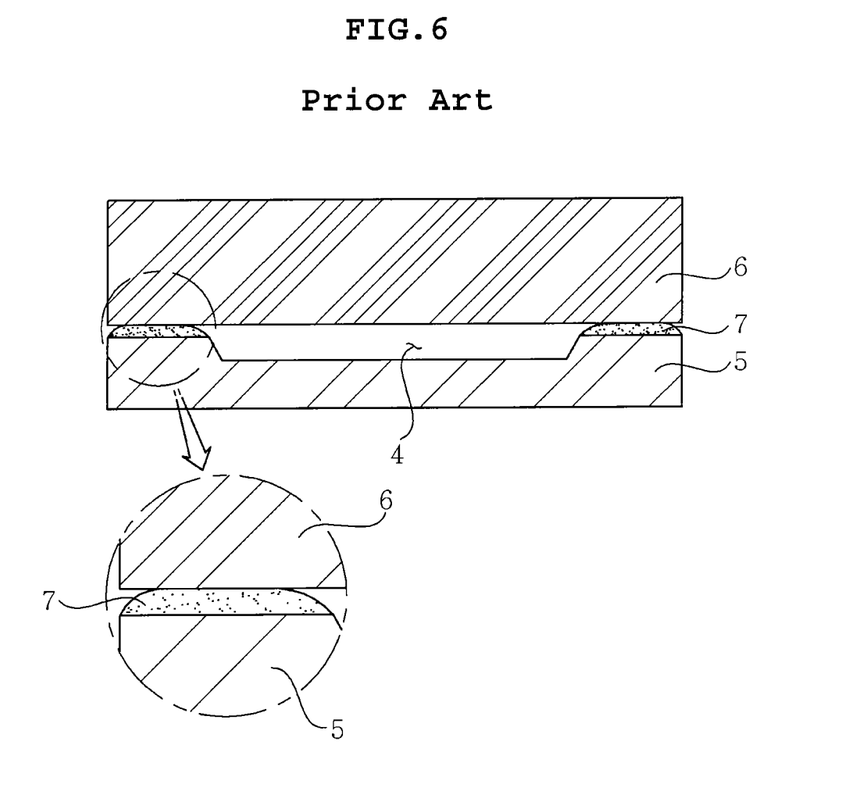

Next, as shown in FIG. 6, a process of bonding the cap 5 on a device substrate 6 is performed. In this case, the device substrate 6 substantially serves to measure the acceleration or the angular velocity and the cap 5 is bonded to the device substrate 6 after applying an adhesive 7 to the border of the cap 5.

As described above, in the method of manufacturing an inertial sensor according to the prior art, the photosensitive resist 2 that has fulfilled its part is removed after the cavity 4 is formed on the substrate 1. As a result, there is a problem in that the photosensitive resist 2 may not be used any more (see FIGS. 4 and 5). In addition, when the adhesive 7 is applied to the border of the cap 5, it is difficult to form the adhesive 7 and the thickness of the adhesive 7 is not constantly formed due to a step occurring by the cavity 4 (see FIG. 6). Therefore, the adhesion between the cap 5 and the device substrate 6 is weak, thereby degrading structural stability of the inertial sensor.

SUMMARY OF THE INVENTION

The present invention has been made in an effort to provide a method of manufacturing an inertial sensor capable of bonding a cap to a device substrate by forming a cavity in a cap using a polymer as an etching resist and then, bonding a cap to a device substrate using the polymer as an adhesive layer.

According to a preferred embodiment of the present invention, there is provided a method of manufacturing an inertial sensor, including: (A) applying a polymer to a base substrate; (B) patterning the polymer so as to form an opening part in the polymer; (C) completing a cap by forming a cavity on the base substrate exposed from the opening part through an etching process in a thickness direction, and (D) bonding the cap to a device substrate by using the polymer.

At the step (A), the base substrate may be a silicone substrate.

The method of manufacturing an inertial sensor may further include thinning the base substrate by reducing the thickness of the base substrate, prior to the step (A).

At the step (B), the opening part may be formed at the central portion of the polymer.

At the step (C), the etching process may be a dry etching process.

The dry etching process may be deep reactive ion etching (DRIE).

At the step (A), the polymer may be applied to the base substrate by using spin coating.

At the step (A), the thickness of the polymer may be constant.

At the step (A), the polymer may be a modified silicone resin.

At the step (D), the cap may be bonded to the top or the bottom of the device substrate.

At the step (D), the device substrate may include: a plate-shaped membrane; a mass body provided on the bottom of the central portion of the membrane; and a post provided on the bottom of the border of the membrane.

BRIEF DESCRIPTION OF THE DRAWINGS

FIGS. 7 to 12A-12C are process cross-sectional views showing a method of manufacturing an inertial sensor according to a preferred embodiment of the present invention in a process order.

DESCRIPTION OF THE PREFERRED EMBODIMENTS

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted.

Hereinafter, preferred embodiments of the present invention will be described in detail with reference to the accompanying drawings.

FIGS. 7 to 12A-12C are process cross-sectional views showing a method of manufacturing an inertial sensor according to a preferred embodiment of the present invention in a process order.

As shown in FIGS. 7 to 12A-12C are, a method of manufacturing an inertial sensor 100 according to an preferred embodiment of the present invention includes (A) applying a polymer 120 to a base substrate 110, (B) patterning the polymer 120 so as to form an opening part 125 in the polymer 120, (C) completing a cap 130 by forming a cavity 115 on the base substrate 110 exposed from the opening part 125 through an etching process in a thickness direction, and (D) bonding the cap 130 to a device substrate 140 by using a polymer 120.

Figure 7:
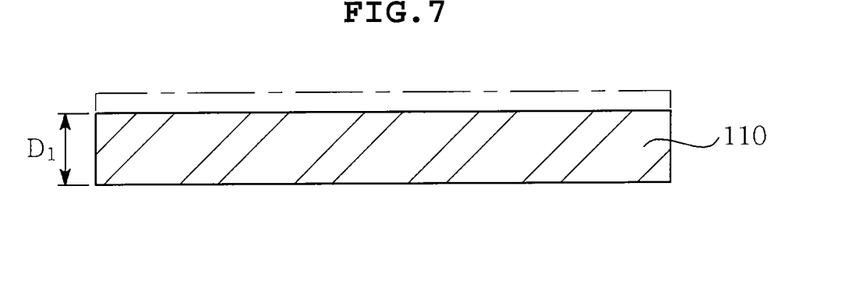

First, as shown in FIG. 7, a process of thinning the base substrate 110 by reducing a thickness D1 of the base substrate 110 is performed. In this case, the thickness D1 of the base substrate 110 is determined in consideration of a thickness D2 (see FIG. 12A) of the finally necessary cap 130. In addition, the thickness D1 of the base substrate 110 may be reduced by a chemical mechanical polishing (CMP) process. The CMP process is to thin the base substrate 110 by combining a mechanical polishing effect by an abrasive and a chemical polishing effect by acid/base solutions. However, when the thickness of the base substrate 110 is the same as the thickness of the finally necessary cap 130, the present process may be omitted.

Figure 8:
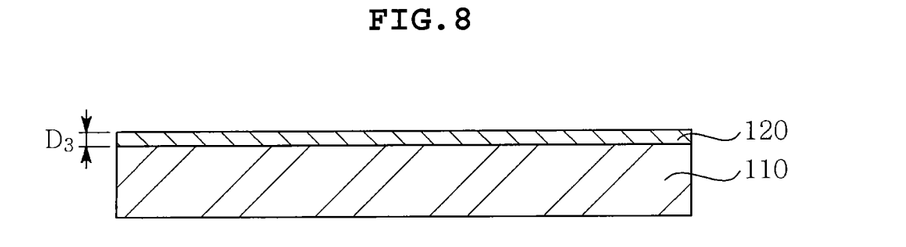

Next, as shown in FIG. 8, a process of applying the polymer 120 to the base substrate 110 is performed. In this case, the material of the base substrate 110 is not particularly limited, but is preferably silicone. In addition, the polymer 120 has the characteristics of both photosensitive and adhesion. Preferably, a modified silicone resin may be used. For example, the polymer 120 may be the modified silicone resin according to the following chemical formula having excellent photosensitivity and adhesion.

<Chemical Formula>

However, the polymer 120 is not necessarily the modified silicone resin, but if the polymer has only the characteristics of both photosensitivity and adhesion, any polymer known to those skilled in the art may be used.

Meanwhile, the polymer 120 may be applied to the base substrate 110 through spin coating. As described above, when the polymer 120 is applied by the spin coating, it is advantageous in excellent reproducibility and a dry process. However, as described in the prior art (see FIG. 6), when the cavity 4 is formed and then, the adhesive 7 is formed by the spin coating, the thickness of the adhesive 7 is not constantly formed due to the step of the cavity 4. On the other hand, the method of manufacturing an inertial sensor 100 according to the preferred embodiment of the present invention applies the polymer over the base substrate 110 before forming the cavity 115 (FIG. 11), such there is no step on the base substrate 110. Therefore, it is very easy to apply the polymer 120 at a predetermined thickness D3. Consequently, since the polymer 120 is applied at a predetermined thickness D3, it is easy to perform the exposing and developing processes (see FIG. 9 and FIG. 10) to perform the bonding when the cap 130 is bonded to the device substrate 140 by using the polymer 120 (see FIG. 12), at steps to be described below.

Figure 9:
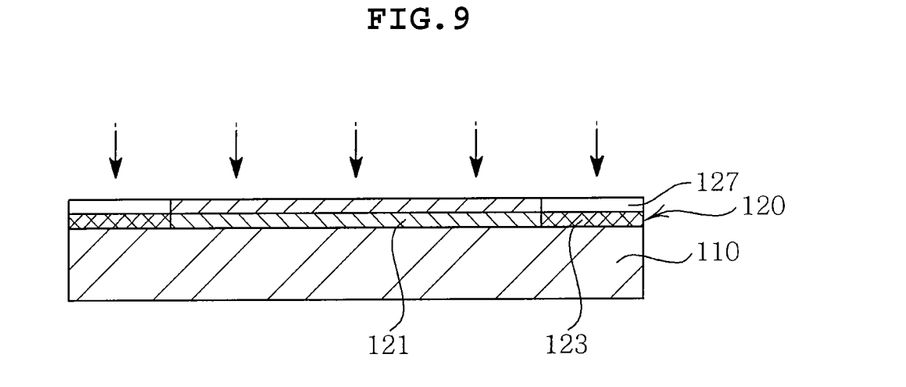
Figure 10:
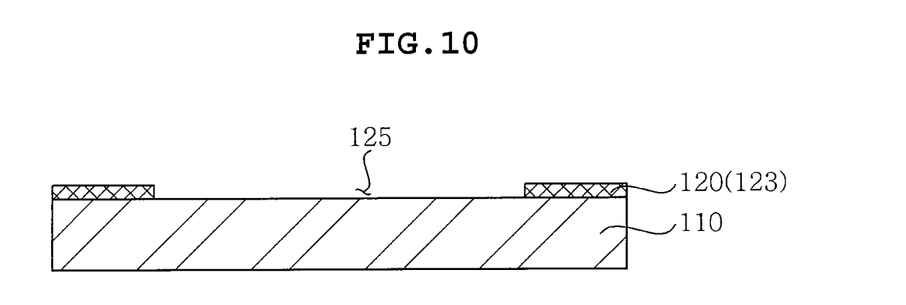

Next, as shown in FIGS. 9 and 10, a process of patterning the polymer 120 is performed so as to form the opening part 125 in the polymer 120.

In detail, as shown in FIG. 9, a process of optionally hardening the polymer 120 is performed. Since the polymer 120 has the photosensitivity, the polymer 120 is optionally hardened when the photomask 127 adheres to the polymer 120 and then, the polymer 120 is exposed to ultraviolet rays (arrow). At the following step, since the central portion 121 of the polymer 120 is provided with the opening part 125, only the border 123 of the polymer 120 is optionally hardened at the present step.

Thereafter, as shown in FIG. 10, the opening part 125 is formed by optionally removing the polymer 120. At the previous process, the opening part 125 may be formed by dissolving and removing the central portion 121 of the polymer 120 that is not hardened by using the developer such as sodium carbonate, potassium carbonate, or the like, since the border 123 of the polymer 120 is hardened.

Figure 11:
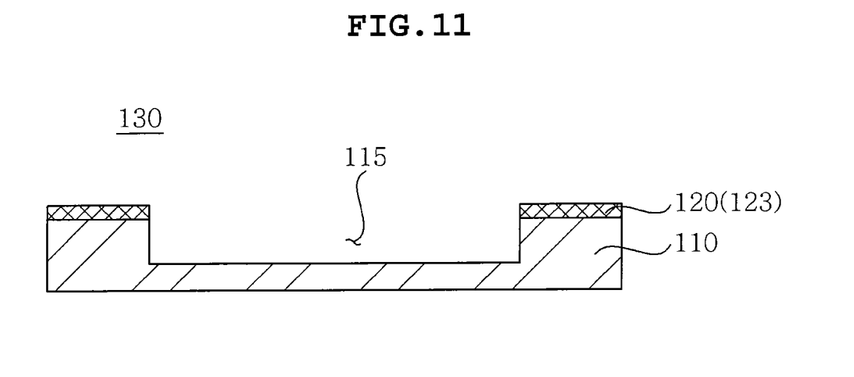

Next, as shown in FIG. 11, a process of completing the cap 130 by forming the cavity 115 on the base substrate 110 exposed from the opening part 125 through the etching process in the thickness direction is performed. The present process uses the polymer 120 as the etching resist to etch the base substrate 110, thereby forming the cavity 115 on the central portion of the base substrate 110 corresponding to the opening part 125 of the polymer 120. In this case, the method of etching the base substrate 110 is not particularly limited, but the dry etching process may be preferably used and deep reactive ion etching (DRIE) may be more preferably used. The DRIE is a method that performs the etching by simultaneously progressing the physical impact and the chemical reaction of the ions formed by plasma. In particular, the DRIE is anisotropic etching, thereby precisely forming the cavity 115. In addition, the DRIE may perform the selective etching according to a material, thereby accurately etching only the base substrate 110 among the polymer 120 and the base substrate 110. Meanwhile, since the thickness of the cavity 115 affects the size of the space in which the mass body 160 of the device substrate 140 may finally move, the thickness of the cavity 115 is determined in consideration of the motion conditions of the mass body 160, or the like.

Figure 12A:
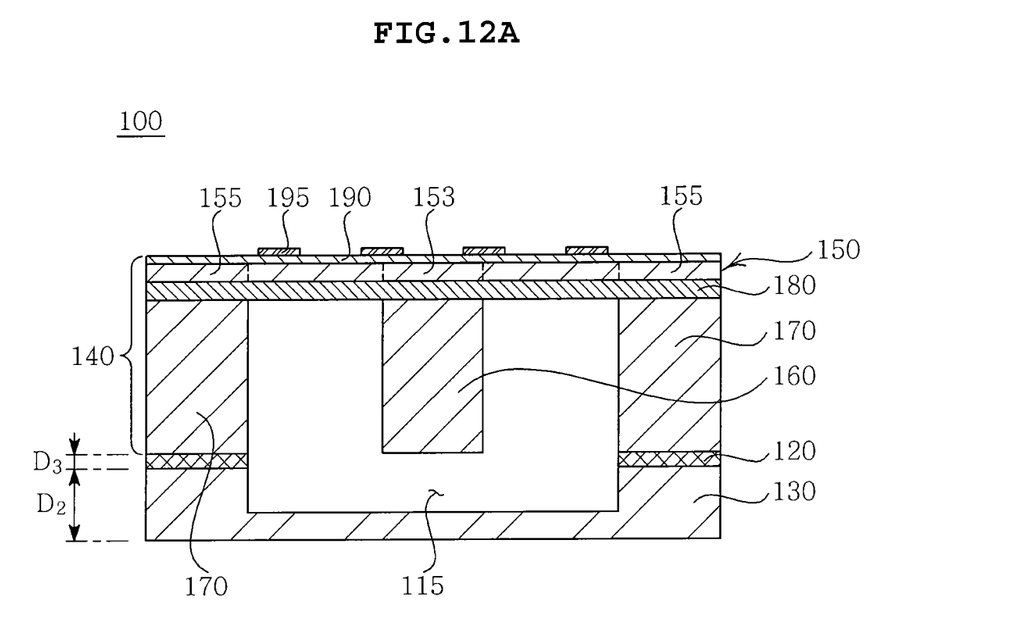
Figure 12B:
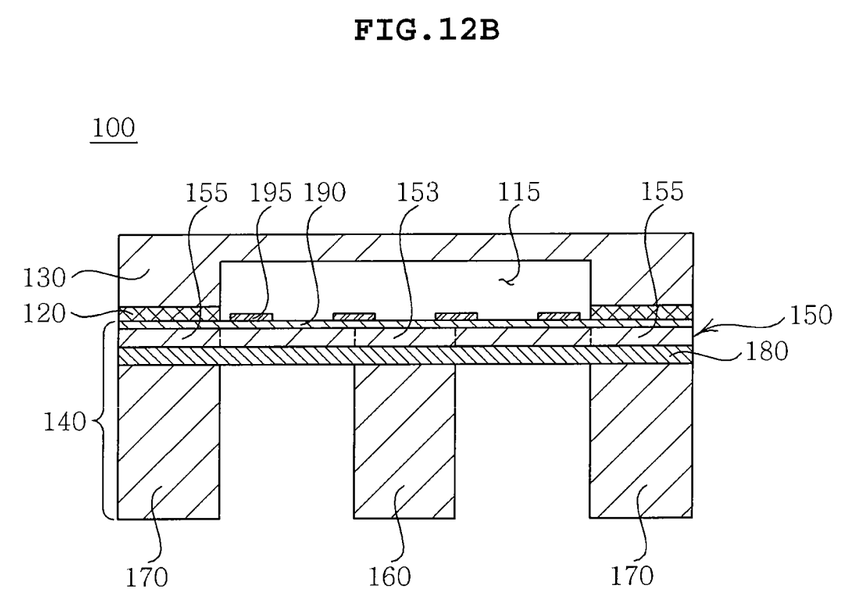
Figure 12C:
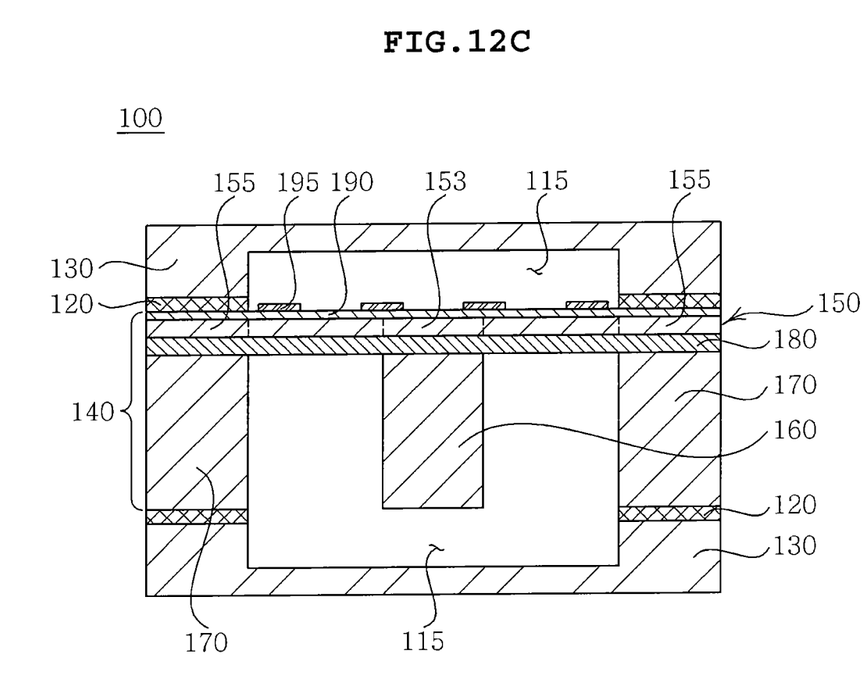

Next, as shown in FIGS. 12A-12C, a process of bonding the cap 130 to the device substrate 140 by using the polymer 120 is performed. Since the polymer 120 has adhesion, the cap 130 is bonded to the device substrate 140 by using the polymer 120 as the adhesive layer at the present process. That is, the polymer 120 is used as the etching resist at the time of etching the base substrate 110 at the previous process and is used as the adhesive layer that finally bonds the cap 130 to the device substrate 140. As described above, the polymer 120 is applied to the base substrate 110 at the predetermined thickness D3. Therefore, when the cap 130 is bonded to the device substrate 140 by using the polymer 120, the bonding is facilitated and the strong adhesion may be implemented, thereby securing the structural stability of the inertial sensor 100.

In addition, the cap 130 may be bonded to the bottom of the device substrate 140 by to using the polymer 120 (see FIG. 12A), the top of the device substrate 140 (see FIG. 12B), and both sides of the device substrate 140 (see FIG. 12C). That is, since the cap 130 serves to protect the device substrate 140, the cap 130 may also be bonded to anywhere of the outer portion of the device substrate 140, if necessary.

Meanwhile, the device substrate 140 substantially serves to measure the acceleration or the angular velocity. The mass body 160 is provided on the bottom of the central portion 153 of the membrane 150 and the post 170 is provided on the bottom of the border 155 of the membrane 150. In addition, an adhesive layer 180 may be provided between the membrane 150 and the mass body 160 and between the membrane 150 and the post 170. Describing the device substrate 140 in more detail, the membrane 150 is formed in a plate shape and has elasticity so as to vibrate the mass body 160 and the mass body 160 generates the displacement or vibration according to the elasticity of the membrane 150 to measure the inertial force or the Coriolis force. In this case, the measurement of the inertial force or the Coriolis force may be performed by using a piezoelectric element 190 and electrodes 195 that are provided on the top of the membrane 150. In addition, the post 170 supports the membrane 150 to serve to secure the space in which the mass body 160 may move. Meanwhile, describing the bonding relationship of the device substrate 140 and the cap 130 in detail, when the cap 130 is provided on the bottom of the device substrate 140, the cap 130 is bonded to the bottom of the post 170 through the polymer 120 (see FIGS. 12A and 12C). In addition, when the cap 130 is provided on the top of the device substrate 140, the cap 130 is bonded to the top of the membrane 150 through the polymer 120 (see FIGS. 12A and 12C).

Meanwhile, although the device substrate 140 is described with reference to the piezoelectric manner, this is only an example and thus, as the device substrate 140, the acceleration or angular velocity sensor in all the manners known to those skilled in the art may be used.

As set forth above, the preferred embodiment of the present invention uses the polymer as the etching resist and again uses the polymer as the adhesive layer to bond the cap to the device substrate when the cap is formed in the cavity, thereby again using the polymer the polymer even after forming the cavity.

In addition, the preferred embodiment of the present invention applies the polymer before the cap is formed in the cavity, thereby easily applying the polymer and making the thickness of the polymer constant without the step.

Although the embodiment of the present invention has been disclosed for illustrative purposes, it will be appreciated that a method of manufacturing an inertial sensor according to the invention is not limited thereby, and those skilled in the art will appreciate that various modifications, additions and substitutions are possible, without departing from the scope and spirit of the invention. Accordingly, any and all modifications, variations or equivalent arrangements should be considered to be within the scope of the invention, and the detailed scope of the invention will be disclosed by the accompanying claims.

What is claimed is:

1. A method of manufacturing an inertial sensor, comprising:
   applying a polymer to a base substrate;
   patterning the polymer so as to form an opening part in the polymer;
   completing a cap by forming a cavity on the base substrate exposed from the opening part through an etching process in a thickness direction; and
   bonding the cap to a device substrate by using the polymer.

2. The method as set forth in claim 1, wherein the base substrate is a silicone substrate.

3. The method as set forth in claim 1, further comprising thinning the base substrate by reducing a thickness of the base substrate, prior to the step of applying the polymer.

4. The method as set forth in claim 1, wherein the opening part is formed at a central portion of the polymer.

5. The method as set forth in claim 1, wherein the etching process is a dry etching process.

6. The method as set forth in claim 5, wherein the dry etching process is deep reactive ion etching (DRIE).

7. The method as set forth in claim 1, wherein at the step of applying a polymer, the polymer is applied to the base substrate by using spin coating.

8. The method as set forth in claim 1, wherein at the step of applying a polymer, a thickness of the polymer is constant.

9. The method as set forth in claim 1, wherein the polymer is a modified silicone resin.

10. The method as set forth in claim 1, wherein at the step of bonding the cap, the cap is bonded to a top or a bottom of the device substrate.

11. The method as set forth in claim 1, wherein the device substrate includes:
- a plate-shaped membrane;
- a mass body provided on a bottom of a central portion of the membrane; and
- a post provided on a bottom of a border of the membrane.

12. A method of manufacturing an inertial sensor, comprising:
- applying a polymer having characteristics of both photosensitivity and adhesion to a base substrate without step;
- patterning the polymer so as to form an opening part in the polymer;
- completing a cap by forming a cavity on the base substrate exposed from the opening part through an etching process in a thickness direction; and
- bonding the cap to a device substrate by using the polymer, wherein the polymer have characteristics of both photosensitivity and adhesion, so the polymer is used as an etching resist at the time of etching the base substrate at the step of completing the cap and is used as an adhesive layer that bonds the cap to the device substrate at the step of bonding the cap.

* * * * *